(12) United States Patent
Basker et al.

(10) Patent No.: US 9,064,744 B2
(45) Date of Patent: Jun. 23, 2015

(54) STRUCTURE AND METHOD TO REALIZE CONFORMAL DOPING IN DEEP TRENCH APPLICATIONS

(75) Inventors: Veeraraghavan S. Basker, Schenetady, NY (US); Hemanth Jagannathan, Guilderland, NY (US); Sivananda Kanakasabapathy, Niskayuna, NY (US); Babar A. Khan, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 13/562,779

(22) Filed: Jul. 31, 2012

(65) Prior Publication Data
US 2014/0038382 A1  Feb. 6, 2014

(51) Int. Cl.
| H01L 21/8242 | (2006.01) |
| H01L 27/12 | (2006.01) |
| H01L 27/108 | (2006.01) |
| H01L 21/225 | (2006.01) |

(52) U.S. Cl.
CPC ...... *H01L 27/1211* (2013.01); *H01L 27/10861* (2013.01); *H01L 27/10894* (2013.01); *H01L 21/2253* (2013.01)

(58) Field of Classification Search
CPC ............ H01L 29/66181; H01L 29/945; H01L 27/10861; H01L 27/10829
USPC .......... 438/243, 249, 386, 388, 392; 257/301, 257/E27.084, E27.092, E27.112
See application file for complete search history.

(56) References Cited

U.S. PATENT DOCUMENTS

| 5,770,484 A | * | 6/1998 | Kleinhenz | 438/155 |
| 7,129,129 B2 | | 10/2006 | Adam et al. | 438/242 |
| 7,615,816 B2 | | 11/2009 | Cheng et al. | 257/301 |
| 7,898,014 B2 | | 3/2011 | Cheng et al. | 257/302 |
| 2009/0230508 A1 | | 9/2009 | Dyer et al. | 257/532 |
| 2012/0104547 A1 | | 5/2012 | Ervin et al. | 257/532 |

OTHER PUBLICATIONS

"HCl selective etching of SiGe versus Si in stacks grown on (110)", J. M. Hartman, et al., Semiconductor Science and Technology 25, 2010, 9 pgs.
"Atmospheric In situ Arsenic-Doped SiGe Selective Epitaxial Growth for Raised-Extension N-type Metal-Oxide-Semiconductor Field-Effect Transistor", Tetsuya Ikuta, et al., Japanese Journal of Applied Physics, vol. 46, No. 4B, 2007, pp. 1916-1920.

\* cited by examiner

*Primary Examiner* — David Vu
(74) *Attorney, Agent, or Firm* — Harrington & Smith

(57) ABSTRACT

The specification and drawings present a new method, ASIC and computer/software related product (e.g., a computer readable memory) are presented for realizing conformal doping in embedded deep trench applications in the ASIC. A common SOI substrate with intrinsic or low dopant concentration is used for manufacturing such ASICs comprising a logic area having MOSFETs utilizing, for example, ultra thin body and box technology and an eDRAM area having deep trench capacitors with the conformal doping.

18 Claims, 8 Drawing Sheets

STRUCTURE AND METHOD TO REALIZE CONFORMAL DOPING IN DEEP TRENCH APPLICATIONS

TECHNICAL FIELD

The exemplary embodiments of this invention relate generally to semiconductor devices and more particularly to deep trench applications with conformal doping formation.

BACKGROUND

The following abbreviations that may be found in the specification and/or the drawing figures are defined as follows:
- ALD atomic layer deposition
- ASIC application specific integrated circuit
- BOX buried oxide
- CMOS complimentary MOS
- DT deep trench
- DT capacitor deep trench capacitor
- DRAM dynamic random access memory
- eDRAM embedded dynamic random access memory
- eSRAM embedded static random access memory
- FET field effect transistor
- Epi epitaxial growth
- FiN fin-type
- FinFET fin-type FET
- IC integrated circuit
- MOSFET metal-oxide-semiconductor FET
- PDSOI partially depleted SOI
- RF radio frequency
- RIE reactive ion etching
- SCE short channel effect
- SOI semiconductor on insulator
- SRAM static random access memory
- STI shallow trench isolation
- TTO trench top oxide
- UTBB ultra thin body and box
- UT Box ultra thin box The growing gap between on-chip gates and off-chip I/O bandwidth argues for larger amounts of on-chip memory. Embedded DRAM, a capacitor-based dynamic random-access memory may be integrated on the same integrated circuit (IC) as an ASIC (application specific IC) or a processor. The cost-per-bit may be higher than for stand-alone DRAM chips but in many applications the performance advantages of placing the eDRAM on the same chip as the processor outweighs the cost disadvantage compared with external memory.

Embedding memory on the ASIC or processor allows for much wider busses and higher operation speeds, and due to much higher density of DRAM in comparison to SRAM, larger amounts of memory can be installed on smaller chips if eDRAM is used instead of eSRAM.

Deep trenches, typically having a depth exceeding one micron in contrast to shallow trenches having a depth less than one micron, are employed in the semiconductor industry to provide a variety of useful devices including a deep trench capacitor. The deep trenches may be utilized in a stand-alone semiconductor circuit such as a dynamic random access memory (DRAM) circuit to provide deep trench capacitors, or may be utilized as an embedded circuit component of a semiconductor chip that also includes other semiconductor circuits such as a processor core or other logic circuits. Particularly, embedded capacitors employing a deep trench are employed to enable an embedded memory device, e.g., an embedded dynamic random access memory (eDRAM) cell, a passive component of a radio frequency (RF) circuit, and decoupling capacitors that provide a stable voltage supply in a semiconductor circuit.

Semiconductor-on-insulator (SOI) substrates are employed in the semiconductor industry for performance benefits due to reduced capacitive coupling between semiconductor devices and the bulk portion of the substrate provided by a buried insulator layer. High performance logic chips are frequently manufactured on an SOI substrate to provide enhanced performance over devices having comparable dimensions and manufactured on a bulk substrate. Incorporation of embedded capacitors into the SOI substrate, however, requires not only formation of deep trenches in the SOI substrate but also formation of a buried plate beneath a buried insulator layer, while preventing diffusion of dopants into a top semiconductor layer above the buried insulator layer.

SUMMARY

According to a first aspect of the invention, a method for fabricating an integrated circuit comprising a logic area and an embedded dynamic random access memory (eDRAM), the method comprising: providing a semiconductor on insulator (SOI) substrate comprising at least an insulator layer between a first semiconductor layer and a second semiconductor layer, at least the first semiconducting layer is intrinsic or comprising a dopant of low concentration; forming deep trenches in the SOI substrate for a plurality of capacitors in the eDRAM area; growing an epitaxial film comprising a further dopant of high concentration on sidewalls and bottoms of the first semiconductor layer of the deep trenches in the SOI; and thermally infusing the further dopant of high concentration into regions adjacent to sidewalls and bottoms in the first semiconductor layer to provide the regions of high dopant concentration in the first semiconductor layer around the deep trenches.

According to a second aspect of the invention, a data processing system that comprises at least one data processor connected with at least one memory that stores computer program instructions for fabricating an application specific integrated circuit comprising a logic area and an embedded dynamic random access memory (eDRAM) by: providing a semiconductor on insulator (SOI) substrate comprising at least an insulator layer between a first semiconductor layer and a second semiconductor layer, at least the first semiconducting layer is intrinsic or comprising a dopant of low concentration; forming deep trenches in the SOI substrate for a plurality of capacitors in the eDRAM area; growing an epitaxial film comprising a further dopant of high concentration on sidewalls and bottoms of the first semiconductor layer of the deep trenches in the SOI; and thermally infusing the further dopant of high concentration into regions adjacent to sidewalls and bottoms in the first semiconductor layer to provide the regions of high dopant concentration in the first semiconductor layer around the deep trenches.

According to a third aspect of the invention, a computer-readable memory that contains computer program instructions, where the execution of the computer program instructions by at least one data processor results in performance of operations that comprise fabricating an application specific integrated circuit comprising a logic area and an embedded dynamic random access memory (eDRAM) by: providing a semiconductor on insulator (SOI) substrate comprising at least an insulator layer between a first semiconductor layer and a second semiconductor layer, at least the first semiconducting layer is intrinsic or comprising a dopant of low concentration; forming deep trenches in the SOI substrate for a plurality of capacitors in the eDRAM area; growing an epitaxial film comprising a further dopant of high concentration on sidewalls and bottoms of the first semiconductor layer of the deep trenches in the SOT; and thermally infusing the further dopant of high concentration into regions adjacent to sidewalls and bottoms in the first semiconductor layer to provide the regions of high dopant concentration in the first semiconductor layer around the deep trenches.

DETAILED DESCRIPTION

Figure 1:
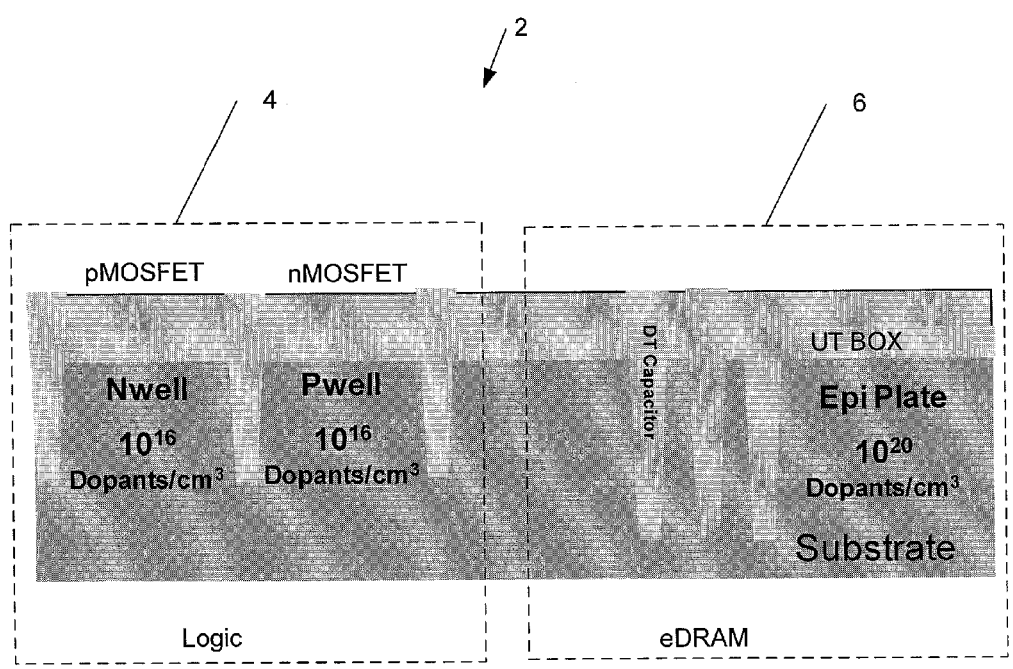
FIG. 1 is a sectional view depicting an ASIC using SOI substrate and comprising eDRAM area having DT capacitors and a logic area for implementing embodiments of the invention.

FIG. 1 shows an ASIC (application specific IC) 2 using SOI (semiconductor on insulator) substrate and comprising eDRAM area 6 having deep trench (DT) capacitors and a logic area 4 comprising metal-oxide-semiconductor field-effect transistors (pMOSFET and nMOSFET) made utilizing, for example, ultra thin body and box (UTBB) technology. As shown in FIG. 1, logic area 4 requires a low doping (e.g., $10^{16}/cm^3$) in the back gate to modulate the threshold voltage $V_t$. On the other hand, the eDRAM area 6 requires high doping density (e.g., $10^{20}$-$10^{21}/cm^3$). Current implementations use high dopant density SOI substrate as shown in FIG. 1 for providing a necessary high dopant density for the eDRAM area 6 which then require a large moat to isolate the logic area 4 and the eDRAM area 6. This represents a technological challenge. Embodiments of the present invention provide a solution for using a low dopant (or intrinsic) substrate in the ASIC shown in FIG. 1, as further described herein.

A new method, ASIC and computer/software related product (e.g., a computer readable memory) are presented for realizing conformal doping in embedded deep trench applications in ASIC comprising a logic area and an eDRAM area.

According to embodiments of the invention, a semiconductor on insulator (SOI) substrate (common for the eDRAM and logic areas of the ASIC) comprising an insulator layer between a first semiconductor layer and a second semiconductor layer is provided, at least the first (or both the first and the second) semiconducting layers are intrinsic or comprising a dopant of low concentration. This is followed at least by forming deep trenches in the SOT substrate for a plurality of capacitors in the eDRAM area, growing a semiconductor epitaxial film comprising a further dopant of high concentration on the semiconducting sidewalls and bottoms of the first semiconductor layer of the deep trenches in the SOL and thermally infusing the further dopant of high concentration into the semiconducting regions adjacent to sidewalls and bottoms in the first semiconductor layer to provide regions of high dopant concentration in the first semiconductor layer around the deep trenches.

FIGS. 2-7 illustrate processing steps for realizing conformal doping in embedded deep trench applications in the eDRAM area, e.g., of the ASIC shown in FIG. 1.

Figure 2:
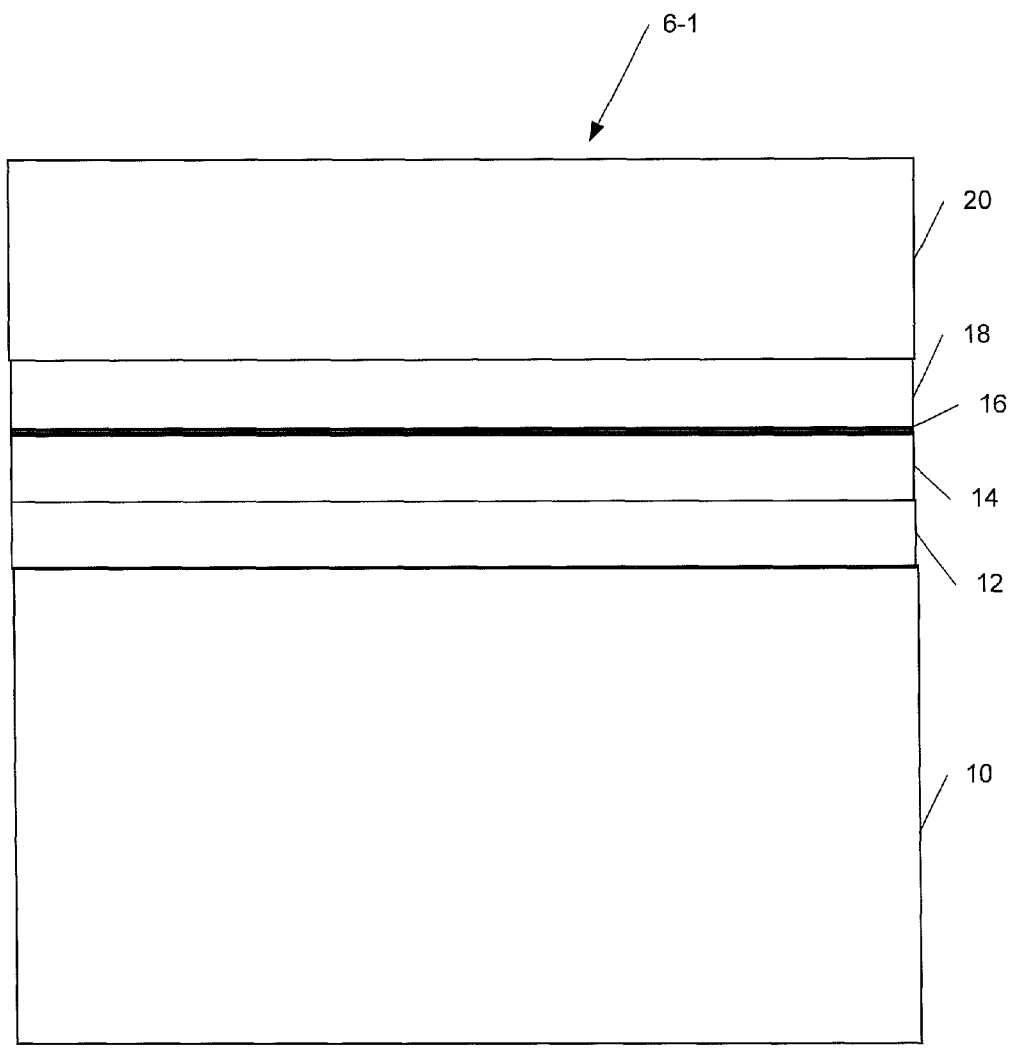
FIG. 2 is a sectional view depicting a starting structure which can be used for implementing embodiments of the invention.

FIG. 2 shows a section 6-1 of a starting structure which can be used for implementing embodiments of the invention. It comprises a SOT substrate containing an insulator layer 12 between a first semiconductor layer 10 and a second semiconductor layer 14, the first and second semiconducting layers are intrinsic or comprising a dopant of low concentration.

The first semiconductor layer 10 can be made of any appropriate semiconductor material including, but not limited to: Si, Ge, GaP, InAs, InP, SiGe, GaAs, silicon-germanium-carbon alloy, III-V compound semiconductor materials, II-VI compound semiconductor materials, organic semiconductor materials, and other compound semiconductor material. The second semiconductor layer 14 may comprise the same semiconductor material as the first semiconductor layer 10 or a different semiconductor material. In a non-limiting example, the first semiconductor layer 10 and/or second semiconductor layer 14 may be a single crystal silicon.

The (buried) insulator layer 12 may be formed on the first semiconductor layer 10 using any of a variety of techniques. For example, a separation by implantation and oxidation (SIMOX) technique or wafer bonding and etch-back technique may be used. The insulator layer 12 can have an insulating material such as buried oxide (BOX). The buried insulator layer 12 may comprise a dielectric material such as silicon oxide and/or silicon nitride. For example, the buried insulator layer 20 may comprise thermal silicon oxide. However, any other type and/or combination of buried insulator material may also be used for the insulator layer 12.

The first semiconductor layer 10 may be undoped, or may have a p-type doping or an n-type doping at a low dopant concentration from about $10^{13}/cm^3$ to about $10^{16}/cm^3$. The thickness of the top semiconductor layer 14 may be from about 5 nm to about 300 nm, and preferably from about 20 nm to about 100 nm. The top semiconductor layer 14 may have a built-in biaxial stress in a horizontal plane, i.e., in the plane parallel to the interface between the buried insulator layer 12 and the top semiconductor layer 14. The thickness of the insulator layer 12 may be from about 20 nm to about 500 nm, and typically from about 100 nm to about 200 nm.

A stack of a pad oxide layer 16, a pad nitride layer 18, and a hardmask oxide layer 20 is sequentially formed on a top surface of the top semiconductor layer 14. The pad oxide layer 16 may comprise a dielectric oxide. The pad oxide layer 16 may be formed by thermal oxidation of a portion of the top semiconductor layer 14 or by chemical vapor deposition. For example, the top semiconductor layer 14 may comprise silicon, and the pad oxide layer 16 may comprise thermally grown silicon oxide. Alternately, the pad oxide layer 16 may be formed by chemical vapor deposition of a dielectric oxide material such as undoped silicate glass or a doped silicate glass. The thickness of the pad oxide layer 16 may be from about 3 nm to about 30 nm, and typically from about 6 nm to about 15 nm, although lesser and greater thicknesses are possible too.

The pad nitride layer 18 may comprises a dielectric nitride. For example, the pad nitride layer 18 may comprise silicon nitride, which may be formed by chemical vapor deposition such as low pressure chemical vapor deposition (LPCVD), rapid thermal chemical vapor deposition (RTCVD), plasma enhanced chemical vapor deposition (PECVD), and high density plasma chemical vapor deposition (HDPCVD). The thickness of the pad nitride layer 50 may be from about 40 nm to about 300 nm, and typically from about 80 nm to about 150 nm, although lesser and greater thickness are possible as well.

The hardmask oxide layer 20 may comprise a dielectric oxide formed by chemical vapor deposition. For example, the hardmask oxide layer 20 may comprise an undoped silicate glass (USG) or a doped silicate glass such as borosilicate glass (BSG). The hardmask oxide layer 20 may be formed by chemical vapor deposition such as low pressure chemical vapor deposition (LPCVD), rapid thermal chemical vapor deposition (RTCVD), plasma enhanced chemical vapor deposition (PECVD), and high density plasma chemical vapor deposition (HDPCVD). The thickness of the hardmask oxide layer 20 may be from about 300 nm to about 1,200 nm, and typically from about 500 nm to about 1,000 nm, although lesser and greater thickness are possible too.

Figure 3:
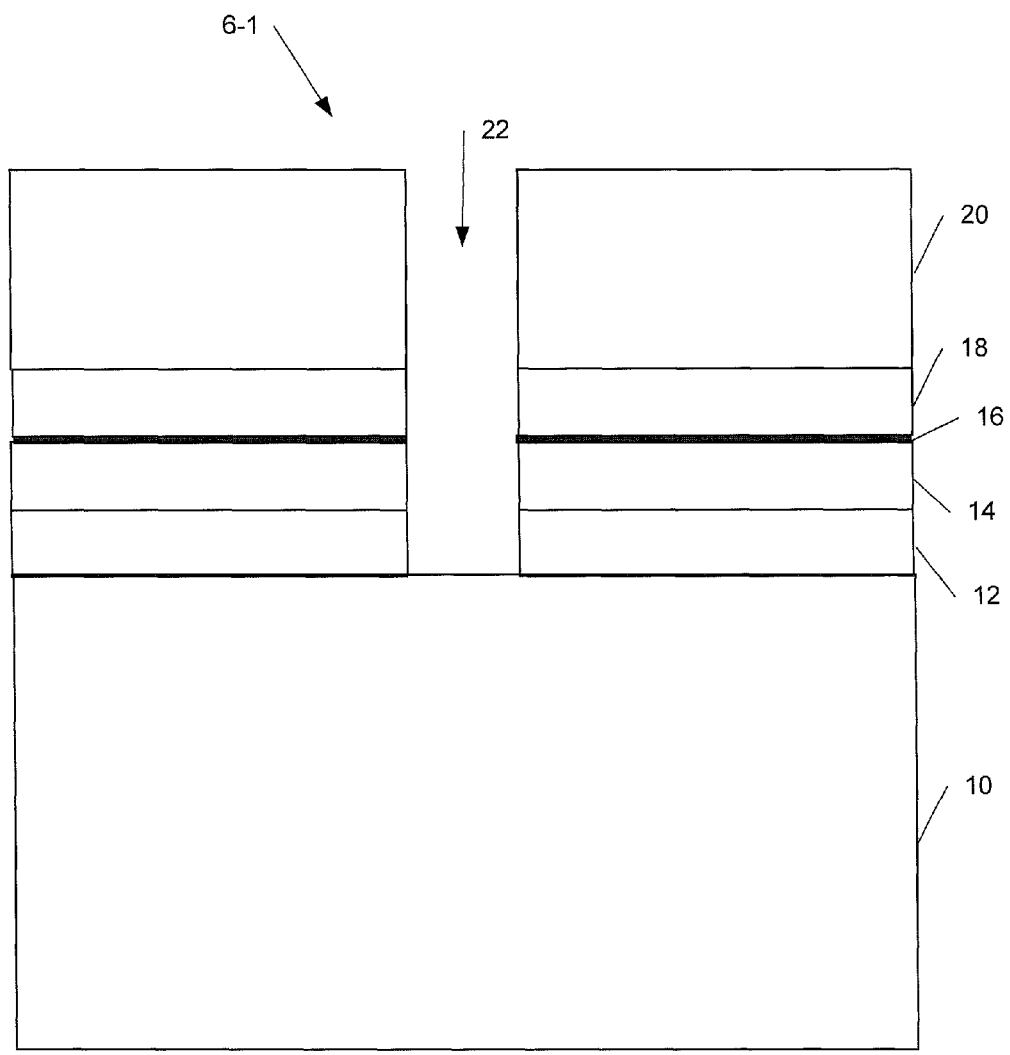
FIG. 3 is a sectional view depicting initial DT opening.
Figure 4:
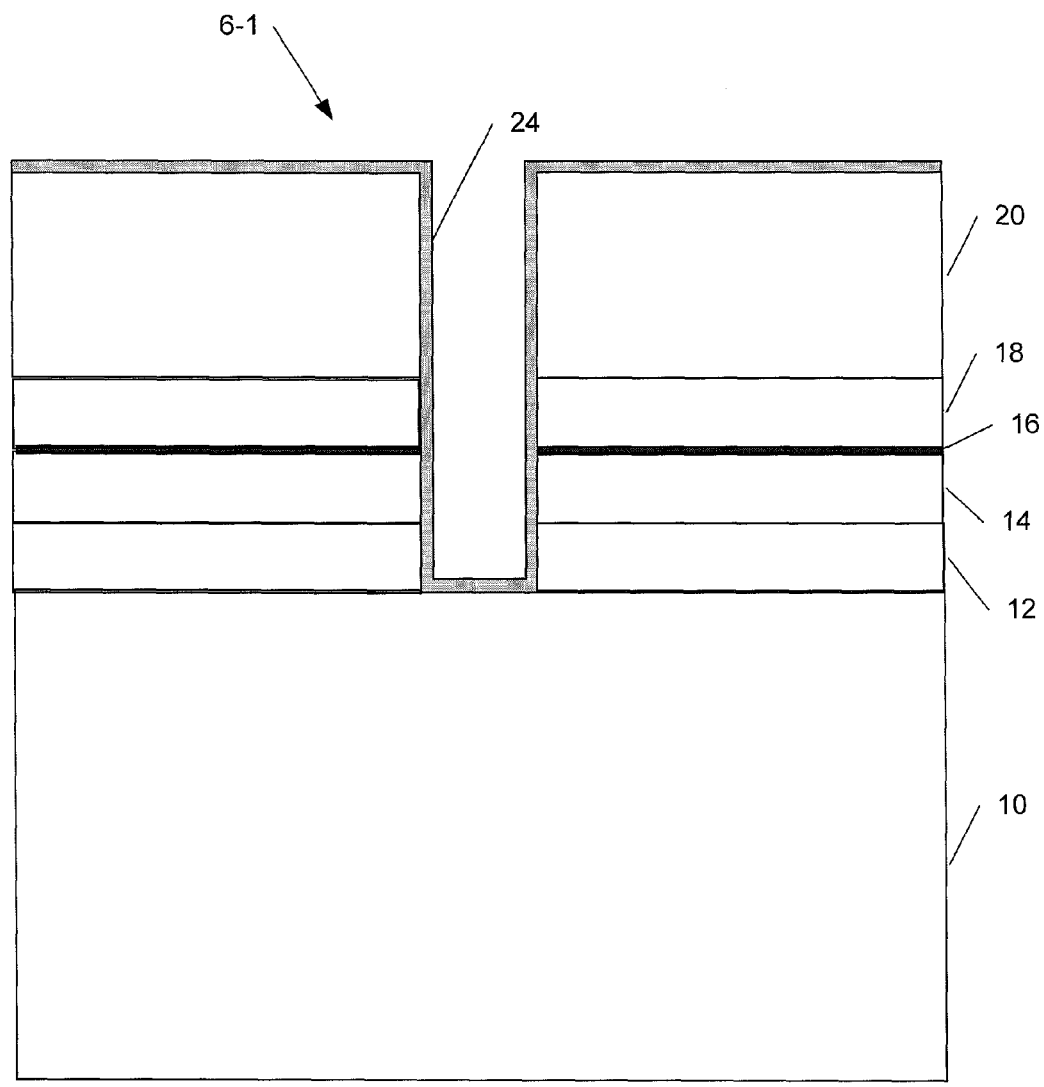
FIG. 4 is a sectional view depicting depositing oxide protection spacer layer.
Figure 5:
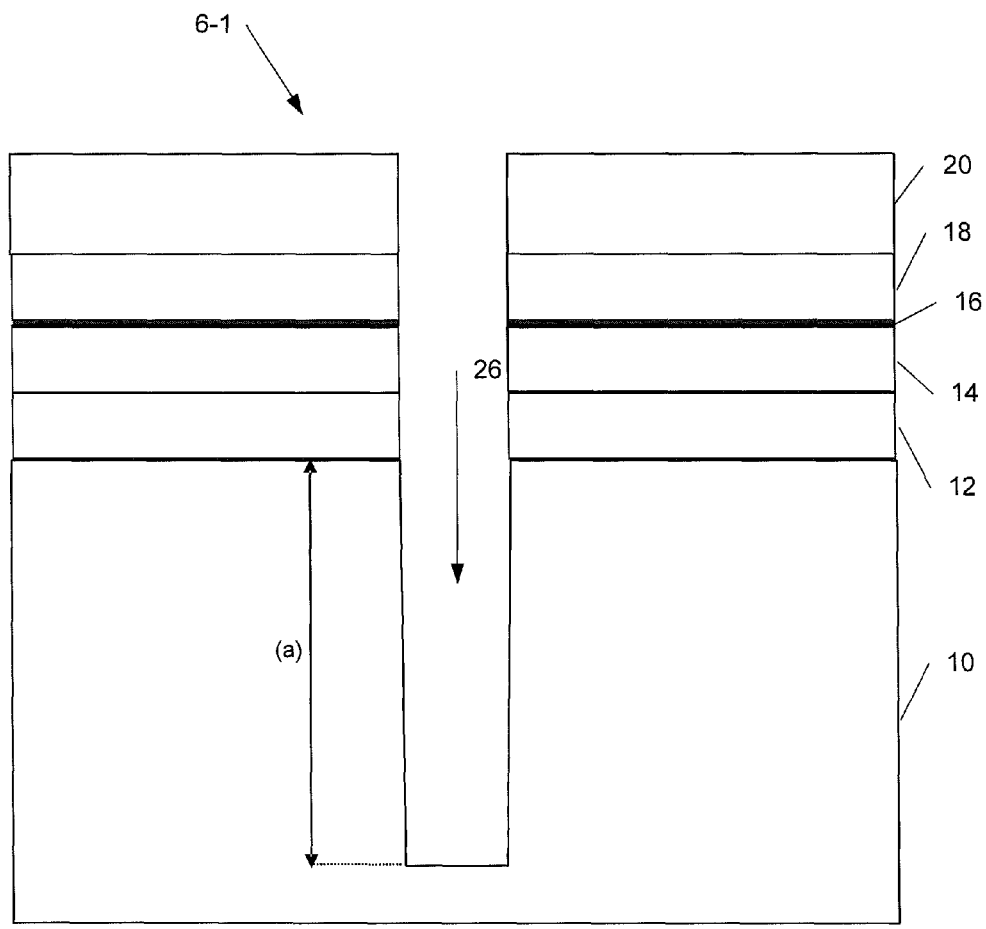
FIG. 5 is a sectional view forming deep trench in the first semiconductor layer using RIE.

FIGS. 3-5 show an exemplary process flow for opening a deep trench structure in section 6-1 of the eDRAM area 6 of FIG. 1 for a DT capacitor. First, as shown in FIG. 3, initial DT opening 22 to the bottom of the oxide layer 12 is performed using a standard lithography, e.g., using reactive ion etching (RIE) to form initial mask opening. Then, as shown in FIG. 4, an oxide protection spacer layer 24, e.g., from crystallized hafnia, is formed. This is followed by a further RIE of the DT in the first semiconductor layer 10 (such as Si) to form the deep trench 26 as shown in FIG. 5.

Figure 6:
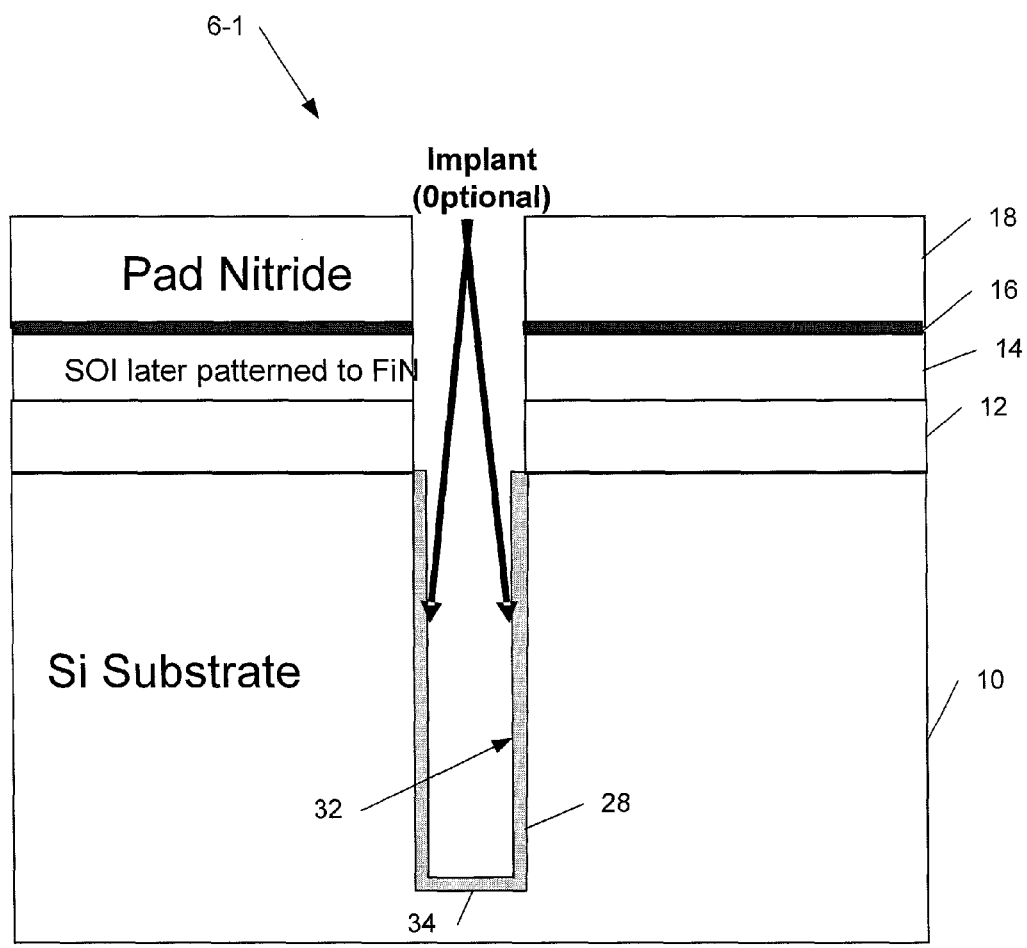
FIG. 6 is a sectional view depicting growing a semiconductor epitaxial film comprising a further dopant of high concentration on semiconducting sidewalls and bottoms of the first semiconducting layer of the deep trenches in the SOI.

FIG. 6 illustrates further process flow step of growing an epitaxial film 32 (semiconducting) comprising a further dopant of high concentration on semiconducting sidewalls 28 and bottoms 34 of the first semiconducting layer 10 in the deep trenches in the SOI. For example, if the first semiconductor layer 10 is made of Si, the grown semiconductor epitaxial film (e.g., about 15 nm thick) may comprises As-doped SiGe as described in Ikuta, et al., "Atmospheric In situ Arsenic-Doped SiGe Selective Epitaxial Growth for Raised-Extension N-type Metal-Oxide-Semiconductor Field-Effect Transistor", Jap. Journal of Appl. Physics, pp. 1916-1920, 2007. In this publication SiGe contains up to 20% of Ge, and As concentration is at least $3.2 \times 10^{19}$ atoms/cm$^3$. But in general the further dopant may be n-type or p-type depending on the need and/or ASIC design requirement (e.g., determined by the dopant type of the first semiconductor layer of the DT).

It is further noted that before the epi process inside the DT as shown in FIG. 6, the SOI sidewall must have a protective layer on it that prevents epi growth on the SOI sidewall. This layer can be very thin (couple of monolayers). This can be accomplished in several ways:

1. The initial sidewall protection layer after DTMO shown in FIG. 4 must be robust enough to leave a thin layer on the SOI sidewall after the DT silicon RIE process. This can be achieved either by increasing the thickness of that layer or by changing the layer material so that it is more robust against the DT Si etch process (e.g., using hafnia or hafnia silicate).

2. We can use a high pressure deposition process that will deposit a protective layer inside the DT near the surface of the DT hole, but will not deposit further down inside the DT. This can be done after the DT etching process. Therefore, the SOI sidewall will be protected during the epi process.

3. Yet another way is to allow the epi to grow on both DT sidewall and SOI sidewall, but then remove it selectively over the SOI before doing the anneal that will drive the dopant into the silicon. This can be done by filling the trench with a spin on coating like ODL, recessing the ODL in the filled DT below the SOI and then removing the exposed epi layer that was grown on the SOI using an etch process that selectively etches that epi and stops on the low doped SOI. The ODL can then be removed by wet etching, allowing the dopant to be driven into the DT in the substrate without doping the SOI.

Moreover, optionally implanting an additional further dopant of the same type as the further dopant may be performed using an angled ion implantation into the epitaxial film 32 on the semiconducting sidewalls 28 and bottoms 34 of the first semiconducting layer 10 of the deep trenches in the SOI to increase the dopant concentration in the epitaxial film 32. The additional further dopant should of the same type as the further dopant but may be made of the same or a different material than the further dopant. But in general the further dopant of high concentration alone or combined with an additional further dopant, if implanted, may have a concentration of about $10^{19}$-$10^{21}$ atoms/cm$^3$ or more.

Figure 7:
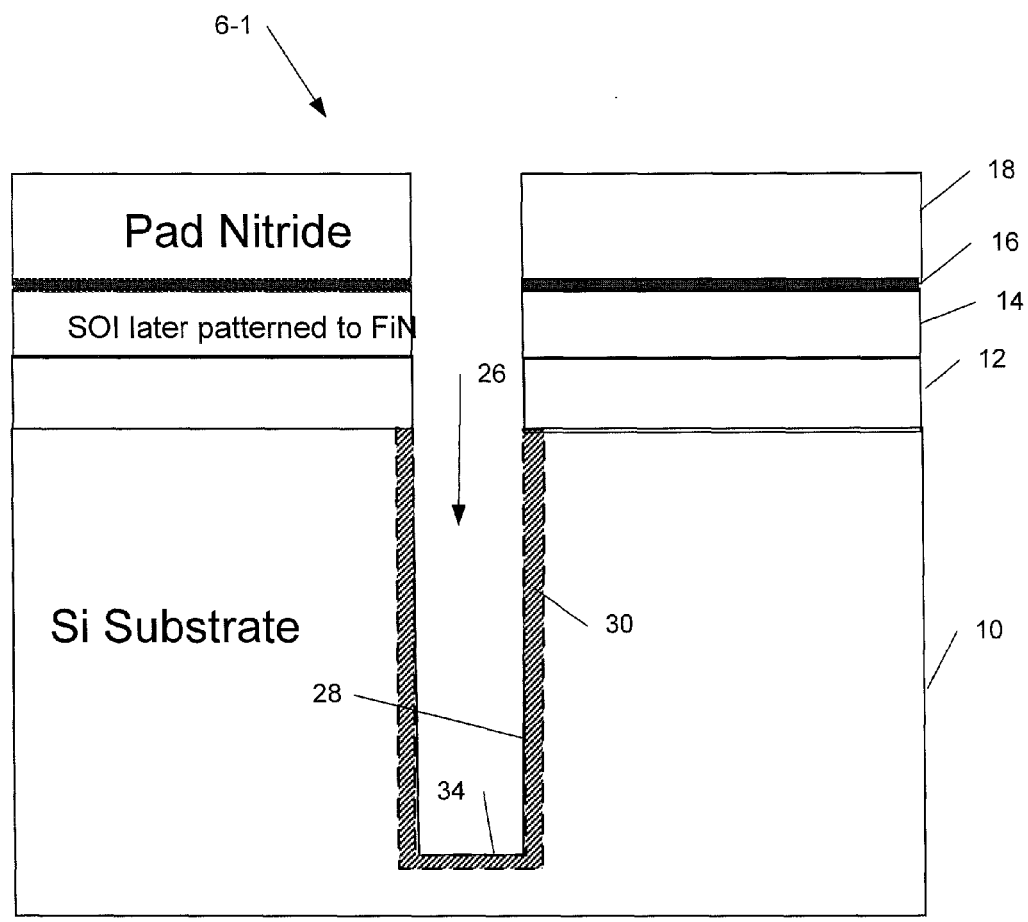
FIG. 7 is a sectional view depicting resulting structure with high dopant concentration around deep trenches, according to an embodiment of the invention.

The process flow further comprises thermally infusing the further dopant (plus the additional further dopant if implanted) of high concentration from the epitaxial film 32 into semiconducting region 30 adjacent to sidewalls 28 and bottoms 34 of the first semiconducting layer 10 of the deep trenches in the SOI to provide regions 30 of high dopant concentration in the first semiconductor layer 10 around the deep trenches (see FIG. 7 further discussed herein).

Then the epitaxial film 32 is removed by selective etching. For example the semiconductor epitaxial film 32 from SiGe may be removed using selective wet etching vs. Si with mixtures of hydrofluoric acid, nitric acid or hydrogen peroxide and acetic acid diluted in deionized water as discussed by J. M. Hartmann, "HCL selective etching of SiGe versus Si in stack grown on (110)", Semiconductor Science and Technology, pp 1-9, 2010. This article further describes selective/dry etching of SiGe versus Si using a gaseous hydrochloric acid (HCl) at high partial pressures of HCl which provide even better results for selective etching of SiGe versus Si than wet etching.

The resulting structure with high dopant concentration in the area 30 after selective removal of epitaxial film 32 is shown in FIG. 7.

The completion of the processing of the DT capacitors in the eDRAM area 6-1 may be performed using a variety of methods known in the art (e.g., see US. Patent Application Publication Numbers 2012/0104547, 2009/0184356 and the like). The same is applied to fabricating of the electronic components such as pMOSFET and nMOSFET utilizing, for example, ultra thin body and box (UTBB) technology in the logic are area 4 shown in FIG. 1.

The novelty of the process described herein is using SOI substrate with intrinsic or low dopant concentration for manufacturing ASICs using this SOI substrate and comprising eDRAM area 6 having deep trench (DT) capacitors and a logic area 4 comparing metal-oxide-semiconductor field-effect transistors (pMOSFET and nMOSFET) utilizing, for example, ultra thin body and box (UTBB) technology (e.g., see FIG. 1). This methodology allows for independent doping densities in eDRAM and logic areas for UTBB on the same chip/ASIC. It further eliminates/lowers the need for a moat isolation since the eDRAM substrate is naturally isolated from rest of the substrate for even non-UTBB (FinFET or PDSOI) technologies. In turn this may enable chip size reduction due to the moat elimination.

Figure 8:
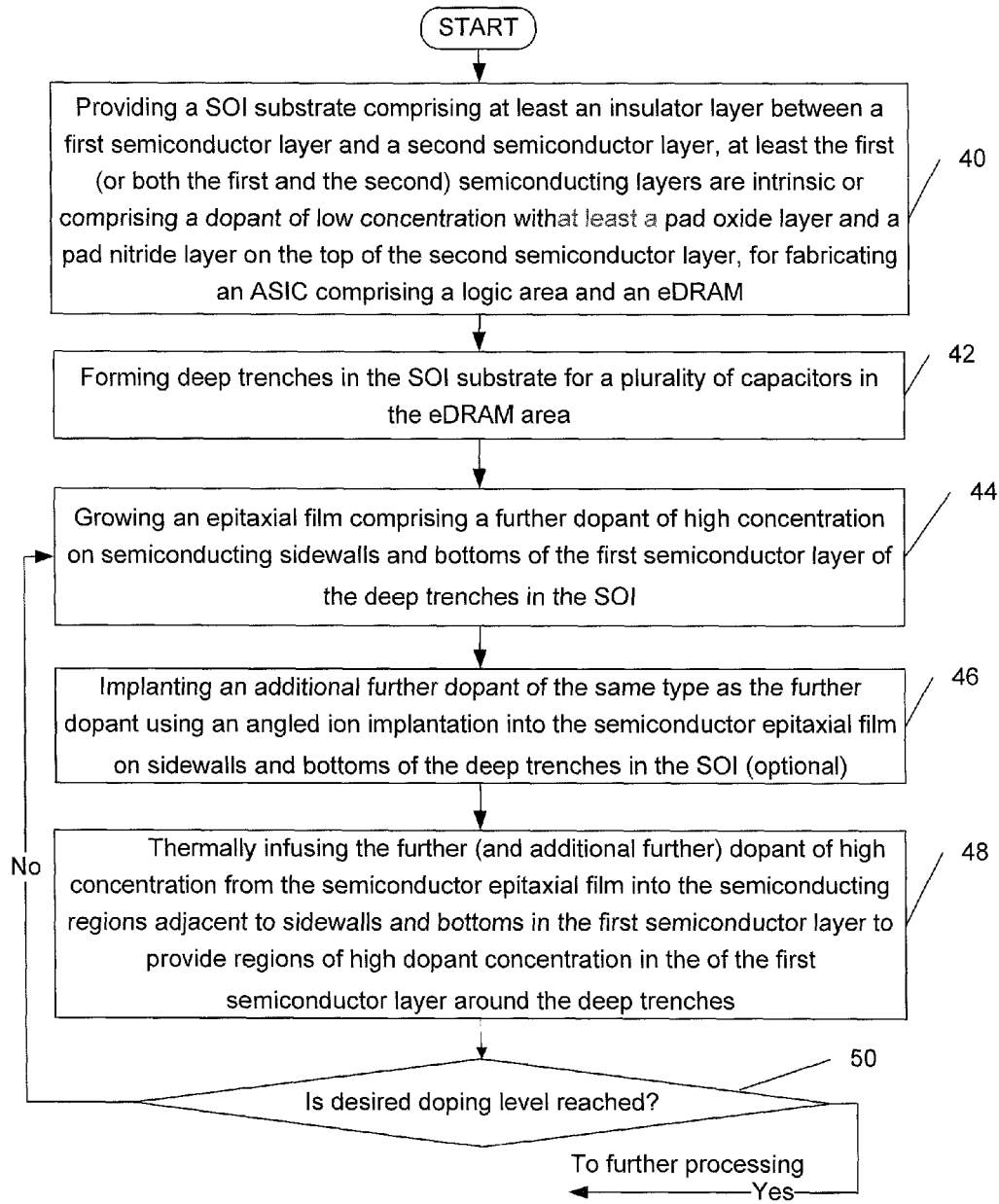
FIG. 8 are flow process chart demonstrating implementation of exemplary embodiments of the invention.

FIG. 8 shows an exemplary flow process demonstrating implementation of embodiments of the invention. It is noted that the order of steps shown in FIG. 8 is not absolutely required, so in principle, the various steps may be performed out of the illustrated order. Also certain steps may be skipped, different steps may be added or substituted, or selected steps or groups of steps may be performed in a separate application.

In a method according to this exemplary embodiment, as shown in FIG. 8, in a first step 40, a SOI substrate comprising at least an insulator layer between a first semiconductor layer and a second semiconductor layer, the first and second semi-conducting layers (e.g., Si) are intrinsic or comprising a dopant of low concentration, with at least a pad oxide layer and a pad nitride layer on the top of the second semiconductor layer, for fabricating an ASIC comprising a logic area and an eDRAM area.

In a next step 42, deep trenches in the SOI substrate for a plurality of capacitors in the eDRAM area are formed as shown in FIGS. 3-5. In a next step 44, an epitaxial film (e.g., SiGe) comprising a further dopant of high concentration (e.g., As with concentration at least $3.2 \times 10^{19}$ atoms/cm$^3$) is grown on sidewalls and bottoms of the first semiconductor layer of the deep trenches in the SOI, as described herein and shown in FIG. 6. In a next optional step 46, an additional further dopant of the same type as the further dopant is implanted using an angled ion implantation into the epitaxial film on the sidewalls and bottoms of the deep trenches in the SOI. In a next step 48, the further dopant (and the additional further dopant if implanted)) of high concentration is thermally infused into the semiconducting regions adjacent to sidewalls and bottoms in the first semiconductor layer to provide regions of high dopant concentration in the of the first semiconductor layer around the deep trenches.

In a next step 50, it is determined whether the desired doping level is reached as a results of thermal infusion. If that is not the case, the process goes back to step 44 to repeat steps 44-48 (typically 5-8 times). If, however, it is determined in step 50 that the desired doping level is reached, the flow process goes to further processing steps according to a known art, as described herein.

It is noted that various non-limiting embodiments described herein may be used separately, combined or selectively combined for specific applications.

Further, some of the various features of the above non-limiting embodiments may be used to advantage without the corresponding use of other described features. The foregoing description should therefore be considered as merely illustrative of the principles, teachings and exemplary embodiments of this invention, and not in limitation thereof.

It is to be understood that the above-described arrangements are only illustrative of the application of the principles of the present invention. Numerous modifications and alternative arrangements may be devised by those skilled in the art without departing from the scope of the invention, and the appended claims are intended to cover such modifications and arrangements.

As should be appreciated by one skilled in the art, aspects of the present invention may be embodied as a method, a computer-readable memory, a data processing system, a semiconductor device, or as a combination of these. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit", "device", "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document a computer readable storage medium may be any tangible, non-transitory medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the computer, partly on the computer, as a stand-alone software package, partly on the computer and partly on a remote computer or entirely on the remote computer or server. In the latter scenario, the remote computer may be connected to the computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, devices, apparatuses, systems and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

The invention claimed is:

1. A method for fabricating an integrated circuit comprising a logic area and an embedded dynamic random access memory (eDRAM), the method comprising:
   providing a semiconductor on insulator (SOI) substrate comprising at least an insulator layer between a first semiconductor layer and a second semiconductor layer, at least the first semiconducting layer is intrinsic or comprising a dopant of low concentration;
   forming deep trenches in the SOI substrate for a plurality of capacitors in the eDRAM area;
   growing a semiconductor epitaxial film comprising a further dopant of high concentration on sidewalls and bottoms of the first semiconductor layer of the deep trenches in the SOI;
   implanting an additional further dopant of a same type as the further dopant using an angled ion implant into the semiconductor epitaxial film on the sidewalls and bottoms of the deep trenches;
   thermally infusing the implanted additional further dopant and the further dopant of high concentration into regions adjacent to sidewalls and bottoms of the deep trenches in the first semiconductor layer to provide the regions of high dopant concentration in the first semiconductor layer around the deep trenches; and
   removing the semiconductor epitaxial film from the sidewalls and the bottoms of the deep trenches by selective etching.

2. The method of claim 1, wherein the SOI substrate comprises at least a pad oxide layer and a pad nitride layer on the top of the second semiconductor layer.

3. The method of claim 1, wherein the first or second semiconductor layer in the SOI is comprised of at least one of Si, Ge, GaP, InAs, InP and SiGe.

4. The method of claim 1, wherein the first and second semiconductor layers in the SOI are comprised of a same material.

5. The method of claim 1, wherein the logic area comprises a plurality of MOSFET transistors fabricated using an ultrathin body and box technology.

6. The method of claim 1, wherein the first and second semiconductor layers comprise the low concentration dopant of n-type.

7. The method of claim 1, wherein the first or second semiconductor layer in the SOI is comprised of Si and wherein the semiconductor epitaxial film comprises As-doped SiGe.

8. The method of claim 7, wherein the SiGe contains up to 20% of Ge.

9. The method of claim 7, wherein an As concentration of the As-doped SiGe is at least $3.2 \times 10^{19}$ atoms/cm$^3$.

10. The method of claim 1, wherein the further dopant is n-type.

11. The method of claim 1, wherein the additional further dopant is comprised of a different material than a material that comprises the further dopant.

12. The method of claim 1, wherein the further dopant of high concentration alone or combined with the implanted additional further dopant has a concentration in a range of $10^{19}$-$10^{21}$ atoms/cm$^3$ or more.

13. The method of claim 1, wherein the dopant of low concentration and the further dopant of high concentration are n-type dopants.

14. The method of claim 1, wherein the selective etching is accomplished by wet etching.

15. The method of claim 1, wherein the selective etching is performed using gaseous HCl.

16. The method of claim 1, wherein the dopant of low concentration has a concentration in a range of $10^{13}$-$10^{16}$ atoms/cm$^3$.

17. A data processing system that comprises at least one data processor connected with at least one memory that stores computer program instructions for fabricating an application specific integrated circuit comprising a logic area and an embedded dynamic random access memory (eDRAM) by:
   providing a semiconductor on insulator (SOI) substrate comprising at least an insulator layer between a first semiconductor layer and a second semiconductor layer, at least the first semiconducting layer is intrinsic or comprising a dopant of low concentration;
   forming deep trenches in the SOI substrate for a plurality of capacitors in the eDRAM area;
   growing a semiconductor epitaxial film comprising a further dopant of high concentration on sidewalls and bottoms of the first semiconductor layer of the deep trenches in the SOI;
   implanting an additional further dopant of a same type as the further dopant using an angled ion implant into the semiconductor epitaxial film on the sidewalls and bottoms of the deep trenches;
   thermally infusing the implanted additional further dopant and the further dopant of high concentration into regions adjacent to sidewalls and bottoms of the deep trenches in the first semiconductor layer to provide the regions of high dopant concentration in the first semiconductor layer around the deep trenches; and
   removing the semiconductor epitaxial film from the sidewalls and the bottoms of the deep trenches by selective etching.

18. A computer-readable memory that contains computer program instructions, where the execution of the computer program instructions by at least one data processor results in performance of operations that comprise fabricating an application specific integrated circuit comprising a logic area and an embedded dynamic random access memory (eDRAM) by:
   providing a semiconductor on insulator (SOI) substrate comprising at least an insulator layer between a first semiconductor layer and a second semiconductor layer, at least the first semiconducting layer is intrinsic or comprising a dopant of low concentration;
   forming deep trenches in the SOI substrate for a plurality of capacitors in the eDRAM area;
   growing a semiconductor epitaxial film comprising a further dopant of high concentration on sidewalls and bottoms of the first semiconductor layer of the deep trenches in the SOI;
   implanting an additional further dopant of a same type as the further dopant using an angled ion implant into the semiconductor epitaxial film on the sidewalls and bottoms of the deep trenches;
   thermally infusing the implanted additional further dopant and the further dopant of high concentration into regions adjacent to sidewalls and bottoms of the deep trenches in the first semiconductor layer to provide the regions of high dopant concentration in the first semiconductor layer around the deep trenches; and
   removing the semiconductor epitaxial film from the sidewalls and the bottoms of the deep trenches by selective etching.

* * * * *